US007464241B2

(12) United States Patent
Vogt

(10) Patent No.: US 7,464,241 B2
(45) Date of Patent: Dec. 9, 2008

(54) MEMORY TRANSACTION BURST OPERATION AND MEMORY COMPONENTS SUPPORTING TEMPORALLY MULTIPLEXED ERROR CORRECTION CODING

(75) Inventor: Pete D. Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 318 days.

(21) Appl. No.: 10/995,850

(22) Filed: Nov. 22, 2004

(65) Prior Publication Data

US 2006/0123320 A1 Jun. 8, 2006

(51) Int. Cl.
*G06F 13/00* (2006.01)
*G11C 29/00* (2006.01)

(52) U.S. Cl. .................. 711/168; 711/111; 714/761; 714/762; 714/768; 714/769

(58) Field of Classification Search .................. 711/111, 711/112, 150, 168; 714/761–764, 766–769
See application file for complete search history.

(56) References Cited

U.S. PATENT DOCUMENTS

| 5,987,627 | A | 11/1999 | Rawlings, III |
| 6,223,322 | B1 | 4/2001 | Michigami |
| 6,304,717 | B1 * | 10/2001 | Fujinami ............... 386/111 |
| 6,604,214 | B1 * | 8/2003 | Fukushima ............ 714/746 |
| 6,941,505 | B2 | 9/2005 | Yada et al. |
| 7,272,774 | B2 * | 9/2007 | Co et al. ............... 714/764 |
| 2002/0029365 | A1 | 3/2002 | Sato et al. |
| 2002/0032891 | A1 | 3/2002 | Yada et al. |
| 2004/0237023 | A1 * | 11/2004 | Takahashi et al. ...... 714/768 |
| 2005/0268203 | A1 * | 12/2005 | Keays et al. ............ 714/758 |

FOREIGN PATENT DOCUMENTS

| EP | 1 313 025 | 5/2003 |
| EP | 131 3025 | 5/2003 |
| EP | 1313025 | 5/2003 |

* cited by examiner

*Primary Examiner*—Jasmine Song
(74) *Attorney, Agent, or Firm*—Philip A. Pedigo

(57) ABSTRACT

Methods and apparatus for use with memory systems and memory modules are included among the embodiments. In exemplary systems, error-correction coding (ECC) data is temporally multiplexed with user data on the same data bus lines in a burst mode transfer, such that separate chips and data lines are not required to support ECC. The memory devices on the modules each contain additional indirectly addressable ECC segments associated with addressable segments of the device. The temporally multiplexed ECC data is read from and written to the indirectly addressable segment associated with the addressable data transmitted in the burst mode transfer. In some embodiments, two types of burst modes are supported, one which includes ECC data and one which does not. This allows one type of memory module to support both ECC and non-ECC systems, and in some cases to use ECC for some data and not for other data in the same system. Other embodiments are described and claimed.

8 Claims, 8 Drawing Sheets

MEMORY TRANSACTION BURST OPERATION AND MEMORY COMPONENTS SUPPORTING TEMPORALLY MULTIPLEXED ERROR CORRECTION CODING

FIELD OF THE INVENTION

This present invention relates generally to digital memory systems, components, and methods, and more particularly to memory system components capable of multiplexing error correction coding data in a burst memory transaction.

BACKGROUND

Digital processors, such as microprocessors, use a computer memory subsystem to store data and processor instructions. Some processors communicate directly with memory, and others use a dedicated controller chip, often part of a "chipset," to access memory.

Conventional computer memory subsystems are often implemented using memory modules. Referring to the computing system 100 shown in FIG. 1, a processor 120 communicates across a front-side bus 125 with a memory controller/hub (MCH) 130 that couples the processor 120 to various peripherals. One of these peripherals is system memory, shown as a memory module MM0. Although memory need not be arranged on such a module in every system, modules are used in many systems to allow memory expansion by replacing a module with a larger-capacity module and/or adding additional modules (not shown) in additional memory slots. When connected, memory module MM0 is addressed from MCH 130 whenever MCH 130 asserts appropriate signals on an Address/Command (ADD/CMD) bus 150. Data transfers between MCH 130 and one of the memory modules occur on a data bus 140.

Typically, memory modules are built using a plurality of semiconductor memory devices, with each individual device storing a portion of each data word stored on the module. For instance, memory module MM0 shows five Dynamic Random-Access Memory (DRAM) devices, DRAM0 to DRAM4. Each DRAM device receives the same address and command signals from ADD/CMD bus 150. Each DRAM device connects to a subset of the signal (DQn) lines making up the data bus 140, with DRAM0 connecting to sixteen bus lines DQ0-DQ15, DRAM1 connecting to DQ16-DQ31, DRAM2 connecting to DQ32-DQ47, DRAM3 connecting to DQ48-DQ63, and DRAM4 connecting to DQ64-DQ71. Thus when 72 bits of data are transferred across data bus 140 during a data cycle, each DRAM is responsible for 16 of those bits, except for DRAM4, which is responsible for eight bits (typically the other eight DQn inputs of DRAM4 are simply unconnected and half of DRAM4 is inaccessible). Each DRAM stores its assigned portion of the 72-bit word in the same chip location as each other DRAM stores its portion of the 72-bit word.

In the FIG. 1 example, the size of each addressable data word is 72 bits. 64 of those bits are used to store data. The additional eight bits are used to store Error Correction Coding (ECC) information corresponding to the 64 bits of data with the same address. For instance, DRAM4 can be dedicated to ECC storage, and DQ64-DQ71 are then used to store and retrieve ECC information. Other systems may use other bus widths, with 36 bits also being common, the bus divided into 32 data bit lanes and 4 ECC bit lanes.

Many current memory devices and controllers offer a burst mode that allows multiple sequentially stored data words to be accessed together with a single command. FIG. 2 shows a timing diagram for a 16-word burst mode data transfer using the ECC memory module MM0 of FIG. 1. MCH 130 supplies module MM0 with a starting address and a burst mode 16 read or write command. When the command is a read command, the DRAMs on module MM0 each read the data storage cells connected to a word line containing the starting address, and then drive the data from the starting address and the fifteen consecutive following addresses on data bus 140 over sixteen consecutive data cycles. When the command is a write command, MCH 130 supplies write data over sixteen consecutive data cycles, which the DRAMs on module MM0 receive, buffer, and then write to consecutive memory locations in a word line, starting at the starting address.

DRAM4 acts just like all other DRAMs during these burst commands, and need not be aware that its data may be used to perform an ECC function on the data stored in DRAM0 to DRAM3. For instance, during time slot T0, data "A" and ECC data "A" are transmitted, where "A" represents data at a starting address specified by MCH 130. During time slot T1, data "B" and ECC data "B" are transmitted, where "B" represents data at the address consecutively following the "A" address.

Not all systems use ECC protection as described above, because ECC protection requires a wider data bus and usually an extra memory chip per memory rank (e.g., DRAM4 and DQ64-DQ71 would not be needed in a 64-bit non-ECC system). Further, ECC generally increases latency (due to the error-checking function) and power consumption (due to the extra chip required). Non-ECC systems otherwise function as described above, except, e.g., the memory controller would trust the data integrity of the data received from DRAM0-DRAM3 in a read operation. Thus ECC and non-ECC memory modules are not interchangeable. Currently, more non-ECC systems are produced than ECC systems, primarily due to the drawbacks listed above.

BRIEF DESCRIPTION OF THE DRAWING

The embodiments may be best understood by reading the disclosure with reference to the drawing, wherein.

DETAILED DESCRIPTION OF THE EMBODIMENTS

This description pertains to a new approach to providing ECC-capable memory system components. This approach can avoid a requirement for dedicated ECC memory devices and dedicated ECC bit lanes, allowing in at least some embodiments for interchangeability between ECC and non-ECC modules. Instead of dedicated ECC devices and bit lanes, the embodiments described herein temporally multiplex ECC data with system data during burst mode transfers across the data bit lanes, with the memory controller and memory devices responsible for handling the mixed data/

ECC burst transfer in a predefined manner. In some embodiments, the memory devices are designed with ECC and non-ECC burst transfer modes, allowing modules to be interchangeably used in both ECC and non-ECC systems—or even in a system that relies on ECC protection for some critical data and not for other data. The preferred embodiments use a memory structure in which ECC data does not occupy directly addressable memory space, but is stored in internally addressable memory areas associated with addressable memory space.

Figure 1:
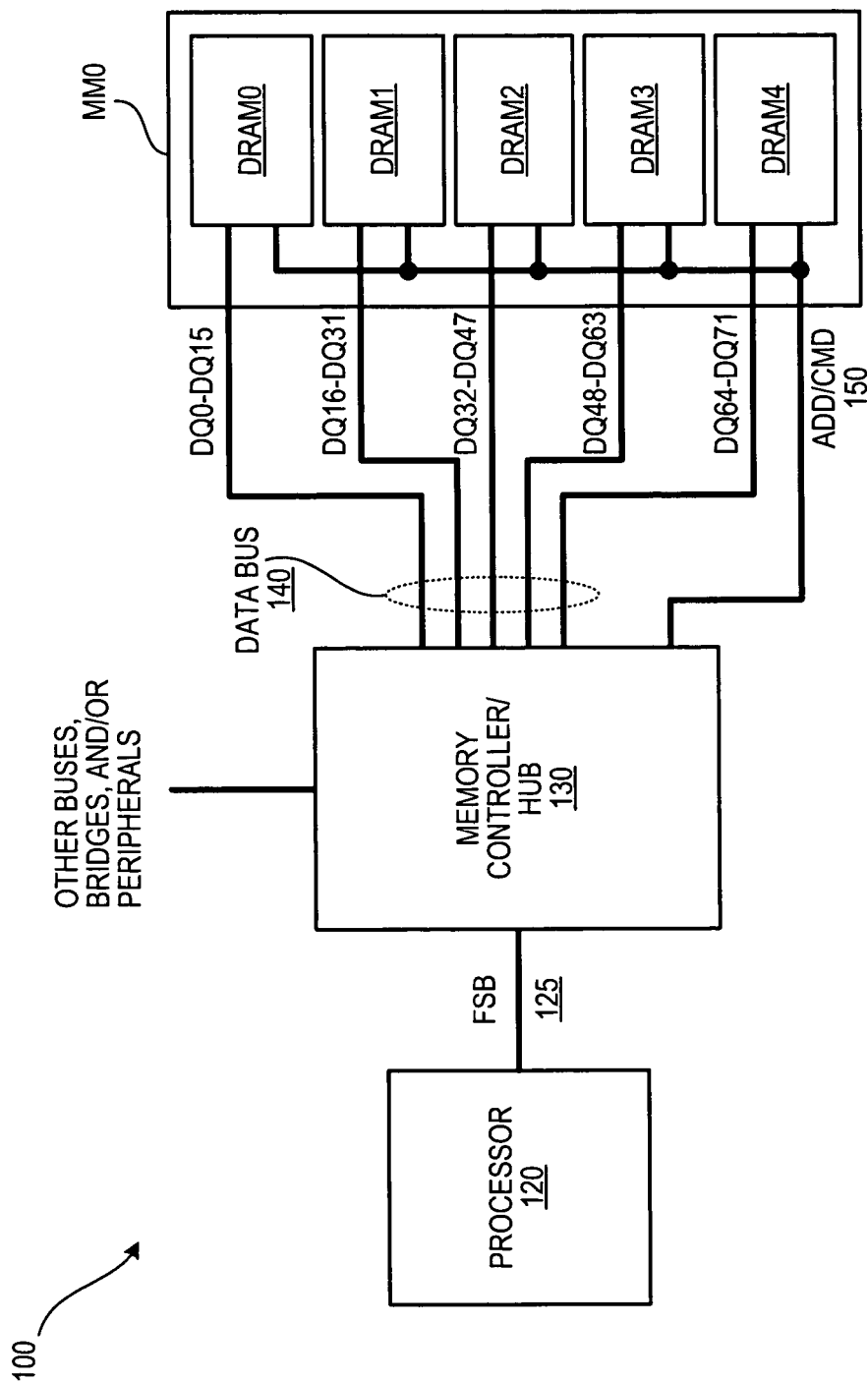
FIG. 1 illustrates a processor and some memory system components of a prior art computer system.
Figure 3:
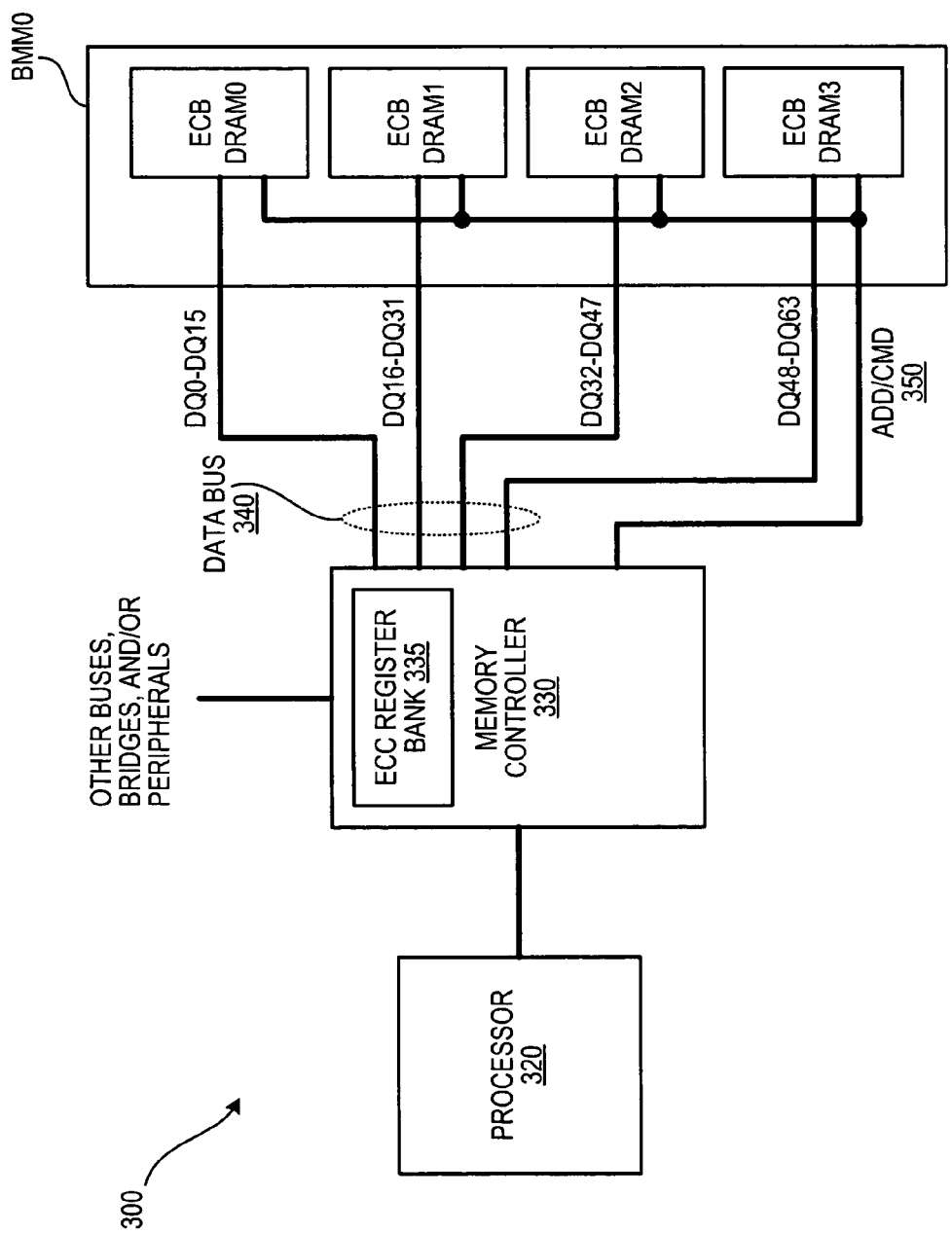
FIG. 3 contains a block diagram for a processor and some memory system components of a computer system according to an embodiment of the invention.

As an introduction to the embodiments, FIG. 3 shows a computing system 300 incorporating a processor 320 coupled to a memory controller 330. Processor 320 and memory controller 330 can be integrated on a single circuit, or may reside on separate circuits connected by a frontside bus in a manner similar to that described for FIG. 1. Memory controller 330 connects in turn to a bimodal memory module BMM0 by an address/command bus 350 and a data bus 340. Data bus 340 is illustrated as having 64 bit lanes DQ0-DQ63, although this is merely exemplary, with other embodiments employing, e.g., 16, 32, or 128 data bus bit lanes. Bimodal memory module BMM0 contains four error-corrected burst mode (ECB) DRAMs ECB-DRAM0, ECB-DRAM1, ECB-DRAM2, and ECB-DRAM3, which will be described further below in a memory device embodiment of the invention. In system embodiments using an error-corrected burst mode, memory controller 330 is designed to receive and transmit error-corrected burst mode data. In some system embodiments using only a prior art non-ECC burst mode, however, it is possible to couple module BMM0 to a prior art non-ECC memory controller.

Figure 2:
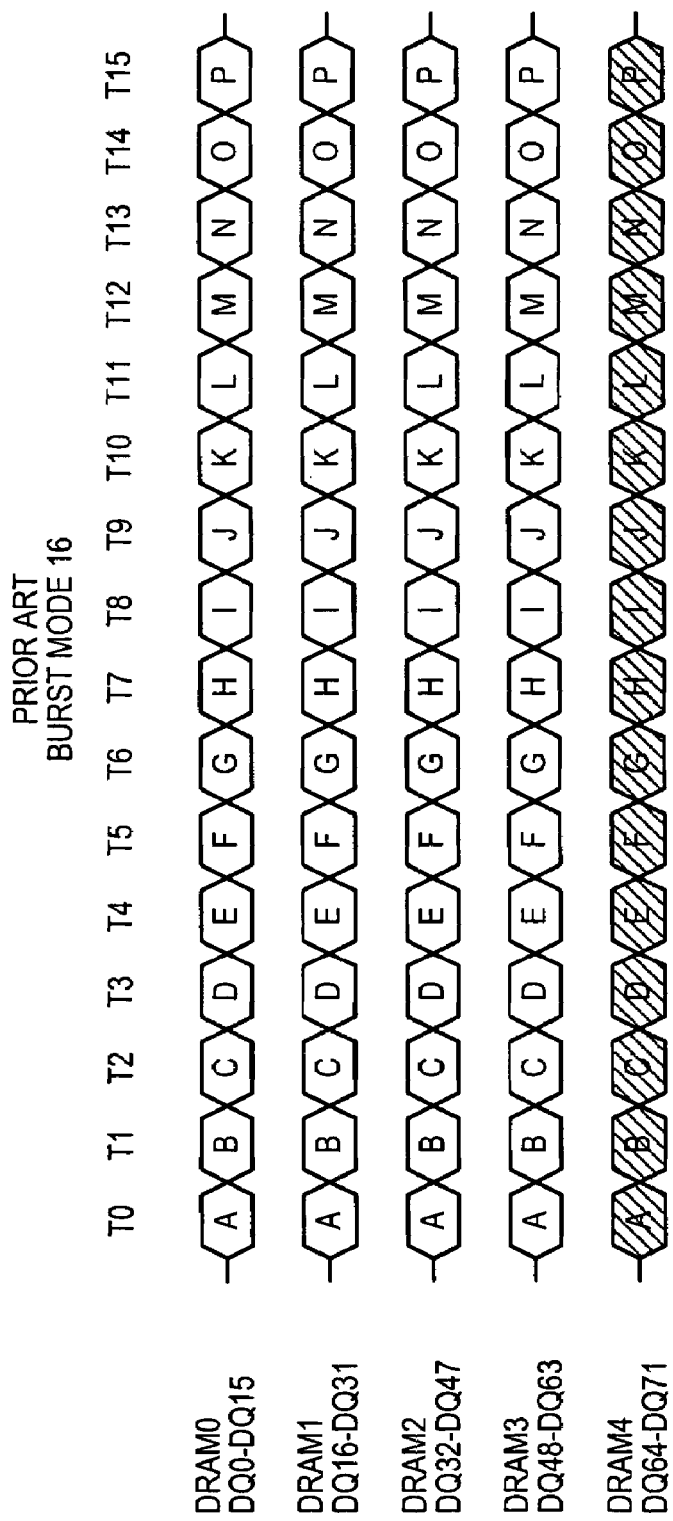
FIG. 2 shows a timing diagram for a burst mode data transfer on the data bus of FIG. 1.
Figure 2:
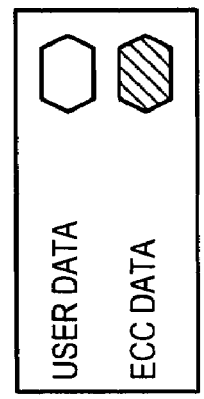
Figure 4A:
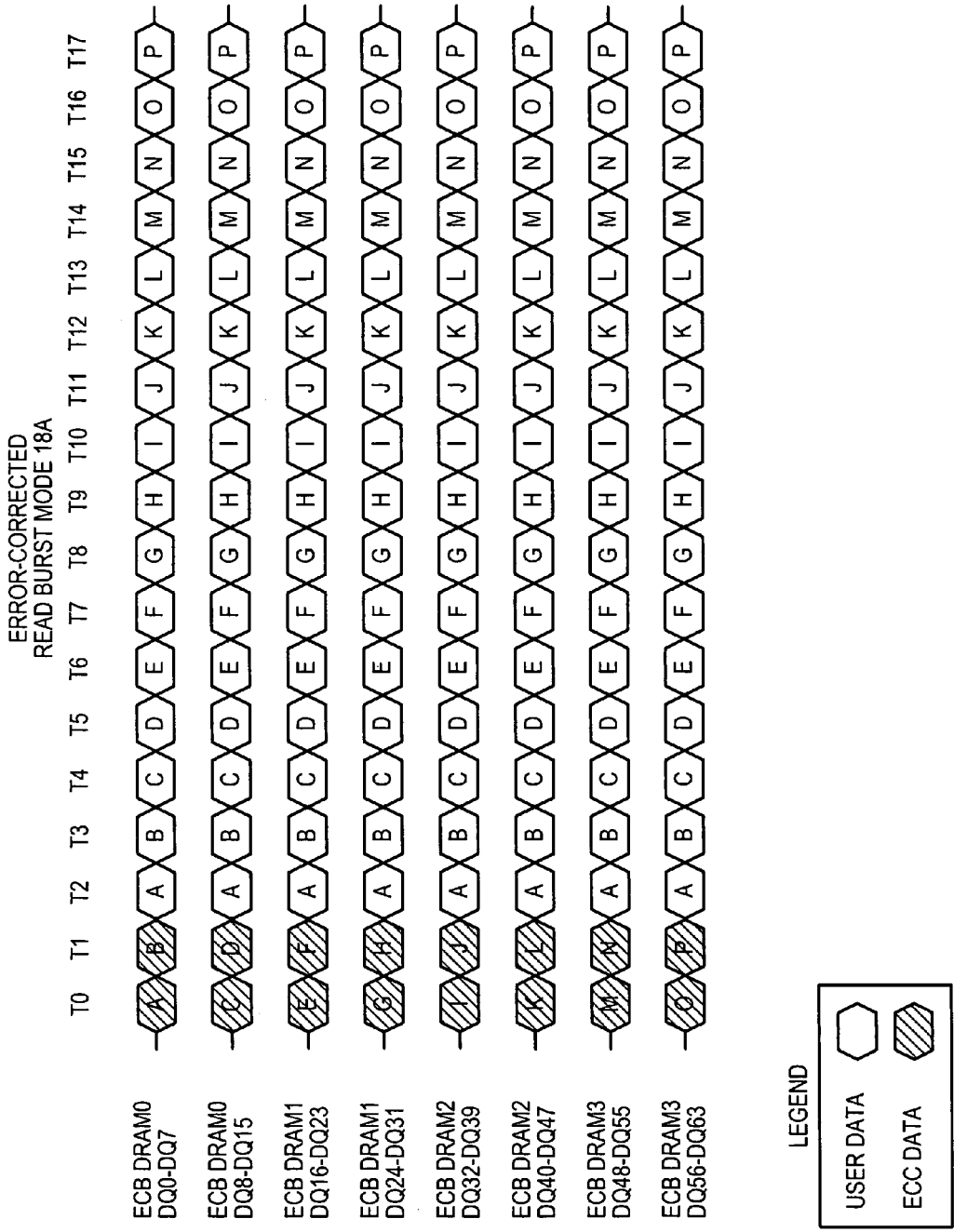
FIGS. 4A, 4B, 5, 6A, 6B, and 6C depict timing diagrams for error-corrected burst mode data transfer according to several embodiments of the present invention.
Figure 4B:
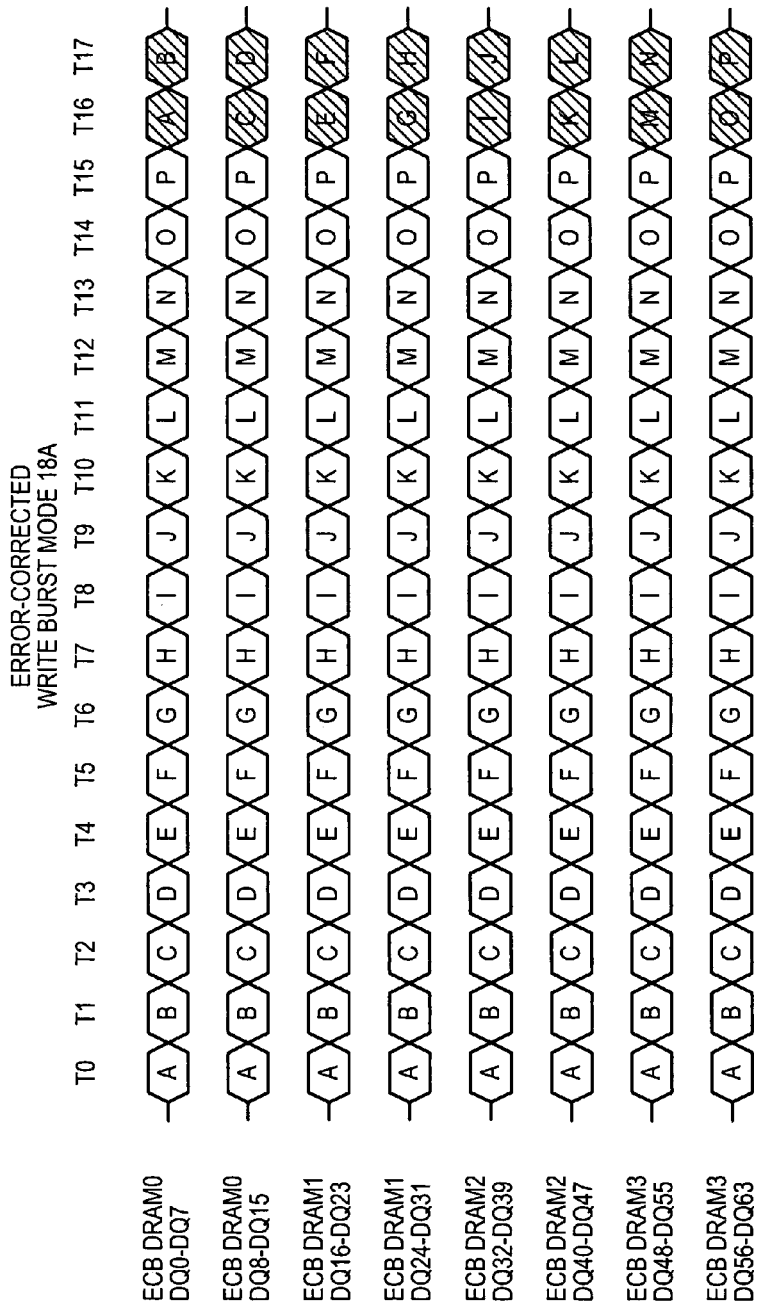

The system-level function of memory controller 330 and the ECB DRAMs can be better understood by examining timing diagrams for error-corrected burst mode data transmission across data bus 340. Referring first to FIGS. 4A and 4B, 18 data cycles T0-T17 of an "Error-Corrected Burst Mode 18A" are depicted. In this example, these 18 data cycles transfer the same 16 72-bit data words A through P that were transferred by the prior art computer system 100 in FIG. 2. Significantly, however, FIG. 4 uses 64 bit lanes and 18 data cycles for the transfer, instead of 72 bit lanes and 16 data cycles as per the prior art. Also, instead of transferring ECC coding for a data word at the same time as the data word, the temporal arrangement of the data is modified from FIG. 2.

Reading and writing of data from BMM0 will be considered in turn. Examining read data cycle T0 of FIG. 4A first, it can be seen that only ECC data is transferred during T0. During data cycle T0, ECC data A and C is transferred from ECB-DRAM0—this ECC data corresponds respectively to data A, which will be transferred by all ECB DRAMs during data cycle T2, and to data C, which will be transferred by all ECB DRAMs during data cycle T4. Also during data cycle T0, ECC data E and G is transferred by ECB-DRAM1—this ECC data corresponds respectively to data E, which will be transferred by all ECB DRAMs during data cycle T6, and to data G, which will be transferred by all ECB DRAMs during data cycle T8. Likewise, during T0 ECB-DRAM2 and ECB-DRAM3 transmit ECC data I, K, M, and O, corresponding respectively to data that will be transferred by all ECB DRAMs during data cycles T10, T12, T14, and T16.

Examining data cycle T1 next, it can be seen that only ECC data is transferred during T1 as well. The transferred ECC data corresponds to the data that will be transferred during the remaining odd data cycles, e.g., T3, T5, T7, T9, T11, T13, T15, and T17.

When memory controller 330 receives the ECC data during T0 and T1, it transfers that data to an ECC register bank 335 containing 16 eight-bit ECC registers. Then, as data is received by memory controller 330 at T2, ECC data "A" is retrieved from its register in bank 335 and used to perform error correction on data A. As data is received by memory controller 330 at T3, ECC data "B" is retrieved from its register in bank 335 and used to perform error correction on data B. This process continues through data cycle T17, when ECC data "P" is read from the last ECC register and used to perform error correction on data P. The error-corrected data words A through P are transferred by memory controller 330 to the processor 320 or to some other peripheral that requested the data with a Direct Memory Access (DMA) command.

It can now be seen that if error-correction were not desired for data words A through P, the same data transfer depicted in FIG. 4 could be used, but without the first two data cycles.

For writing data to BMM0, the data cycle structure shown in FIG. 4B is used in one embodiment. Data words A through P are transferred to all ECB DRAMs respectively during data cycles T0 through T15. As memory controller 330 prepares each data word for transmission, it calculates corresponding ECC data and stores that ECC data in one of the 16 ECC registers in bank 335 described previously. Then, during data cycle T16, ECC data A, C, E, G, I, K, M, and O are transferred to the ECB DRAMs as shown. During data cycle T17, the remaining ECC data B, D, F, H, J, L, N, and P are transferred to the ECB DRAMs as shown.

It will be recognized that the particular arrangement of ECC data is exemplary. For instance, during the first ECC data cycle the ECC data values A-H could be transferred and during the second ECC data cycle the ECC data values I-P could be transferred. As long as memory controller 330 is consistent with reading and writing, any convenient arrangement could be utilized. As will be explained shortly, in the described embodiments the ECB DRAMs need only understand the data cycle format and need not comprehend how ECC data is apportioned by the memory controller among the memory devices.

Figure 5:
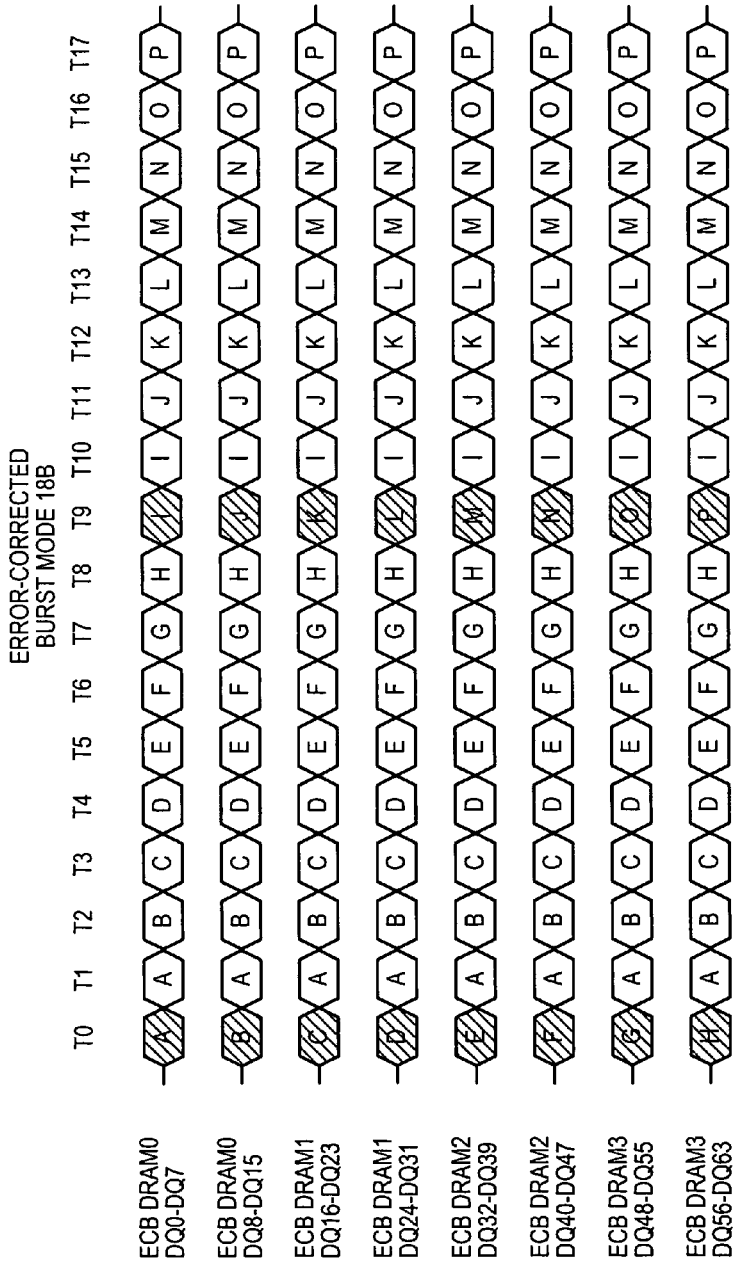

FIG. 5 shows an alternate burst mode 18B. In this burst mode, one ECC data cycle is interspersed with a corresponding eight cycles of data. During the ECC data cycle, ECC data for each of the corresponding eight cycles is transmitted. In one embodiment, during data cycle T0 ECC data is transferred corresponding to data words A-H, to be transmitted during the following eight cycles T1-T8. Then, during data cycle T9 ECC data is transferred corresponding to data words I-P, followed by the data words I-P during data cycles T10-T17. Note that FIG. 5 consists of two joined nine-data-cycle bursts, suggesting that this mode could also be used for a burst mode 9 transfer by performing half the transfer. Also, burst mode 18B can be modified for write operations such that eight data cycles of user data are transferred first, followed by one data cycle of ECC data corresponding to the eight data cycles of user data.

Figures 6A, 6B, 6C:
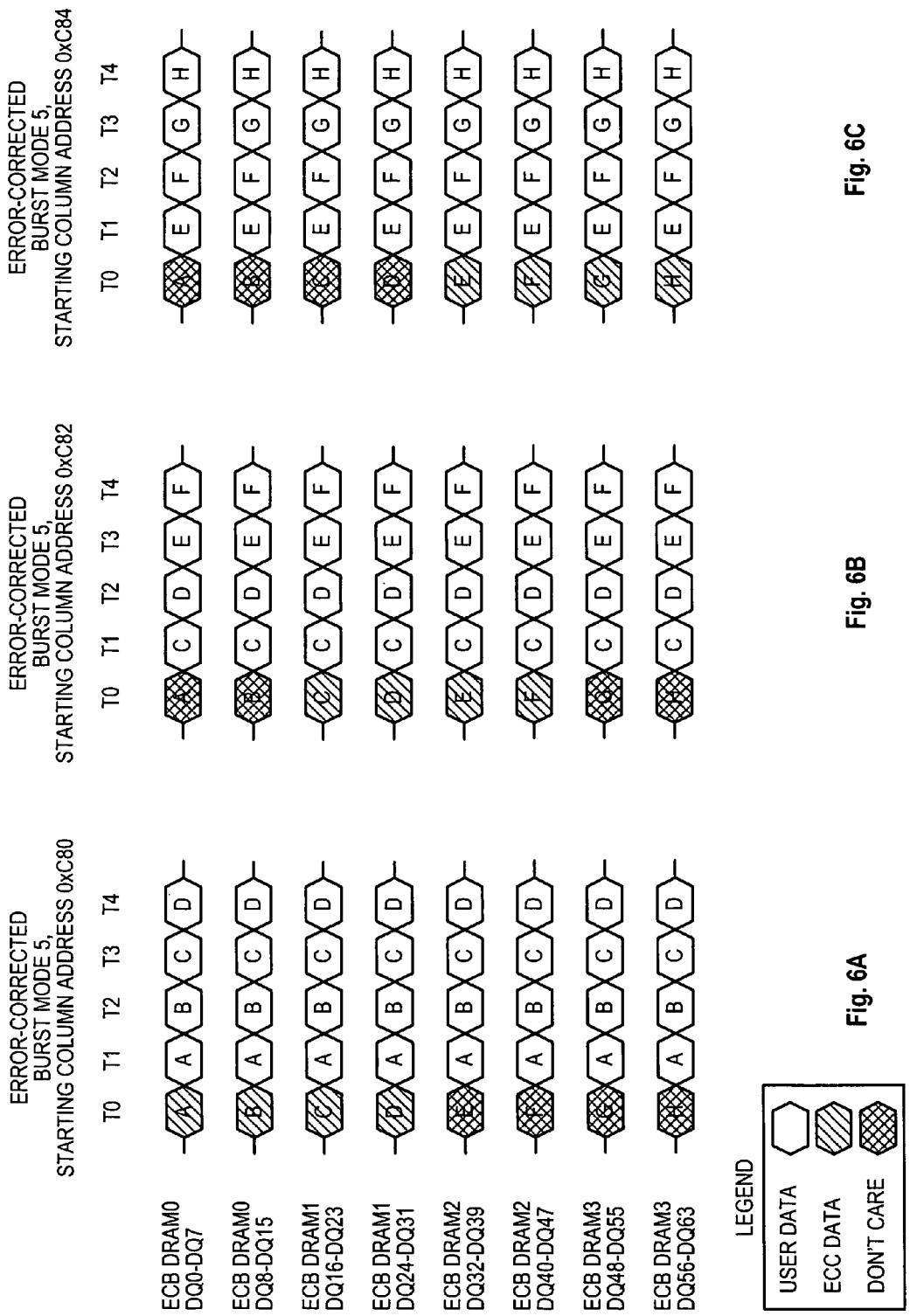

The preceding timing embodiments illustrate situations where an integer relationship exists between the number of ECC values that can be transferred in a data cycle and the burst length of corresponding data. FIGS. 6A-6C illustrate an embodiment where this need not hold true.

In FIG. 6A, memory controller 330 requests an error-corrected burst mode 5 transfer, which transfers one data cycle of ECC data and four data cycles of user data from the ECB DRAMs. This transfer is identical to the first five data cycles of FIG. 5, but truncates after data cycle T4. Note that ECC data E-H, received from ECB-DRAM2 and ECB-DRAM3, is "don't care" data—although it is transferred and loaded in ECC register bank 335 by memory controller 330, it is never used.

For this example, suppose the column address supplied to the ECB-DRAMs is 0xC80, where 0x represents hexadecimal notation and user data "A" is stored at column address 0xC80 and a certain row address RA. The ECC data "A" and "B" are associated in ECB-DRAM0 memory with row address RA and column addresses 0xC80-87. The retrieval of any user data in that address range from the ECB-DRAM0 memory array also causes the retrieval of the ECC data "A" and "B" from ECC memory array elements associated with row address RA and column address 0xC8[0b0XXX], where the value in brackets is in binary (0b) notation and "X" represents a don't care bit. Likewise, the ECC data "I" and "J" are stored in ECC memory array elements associated with row address RA and column address 0xC8[0b1XXX]. In normal user ECC burst mode, the memory controller cannot explicitly address these ECC memory array elements, but it comprehends that these ECC memory array elements will be accessed in ECC mode when user data at the corresponding user space addressing is supplied.

It is also noted that if a burst spans two ECC associations (for instance requesting a four-word burst G-J from FIG. 4A), the memory system can be designed to increase the burst by one data cycle and supply both ECC associations.

In each of FIGS. 6A, 6B, and 6C, memory module BMM0 returns the same ECC data but different user data. Depending on the low-order bits of the column address, the memory controller will select which ECC data to use and which ECC data to disregard. For instance, in FIG. 6B the starting column address is 0xC82, such that the ECC data returned from ECB-DRAM1 and ECB-DRAM2 will be used and the ECC data returned from ECB-DRAM0 and ECB-DRAM3 will be disregarded. In FIG. 6C the starting column address is 0xC84, such that the ECC data returned from ECB-DRAM2 and ECB-DRAM3 will be used.

Although other burst lengths are not illustrated, those of ordinary skill in the art can apply the above principles to, e.g., a burst length 3 (including one ECC data cycle) burst mode, a burst length 2 (including one ECC data cycle) burst mode for transferring user data from a single address, and any other burst length that has not been specifically mentioned.

In some embodiments, it is possible to also write user data and ECC data in a burst length that includes some invalid ECC data. In one embodiment, the memory devices include data masking (DM) signaling inputs, and the memory controller asserts appropriate masking lines during ECC data cycles to prevent ECC data from being written to ECC locations that do not correspond to the user data being written. For instance, in FIG. 6B, the memory controller could assert the DM inputs for ECB-DRAM0 and ECB-DRAM3 during T0, such that only ECB-DRAM1 and ECB-DRAM2 actually pick up ECC data during T0 and save that ECC data to ECC memory.

In another embodiment, DM signaling inputs are either nonexistent or are not used to control ECC data on the data bus lines. Instead, a module position register in the Mode Register Set (MRS) of each memory device is programmed with that device's position on BMM0, or the option is hard-coded when the module is built. Logic in each memory device compares the column address range requested for a write with the module position register in order to decide whether the ECC data supplied to the device should be written or ignored. For instance, on ECB-DRAM0, the MRS module position register is programmed with the values 000 and 001. When the column address range of a write burst includes the low-order address 000, ECB-DRAM0 will save to its ECC memory space the ECC data received at T0 on DQ0-DQ7, and otherwise it will not save that data. Similar logic for the low-order address 001 determines whether the ECC data received at T0 on DQ8-DQ15 will be saved to the ECC memory space.

Figure 7:
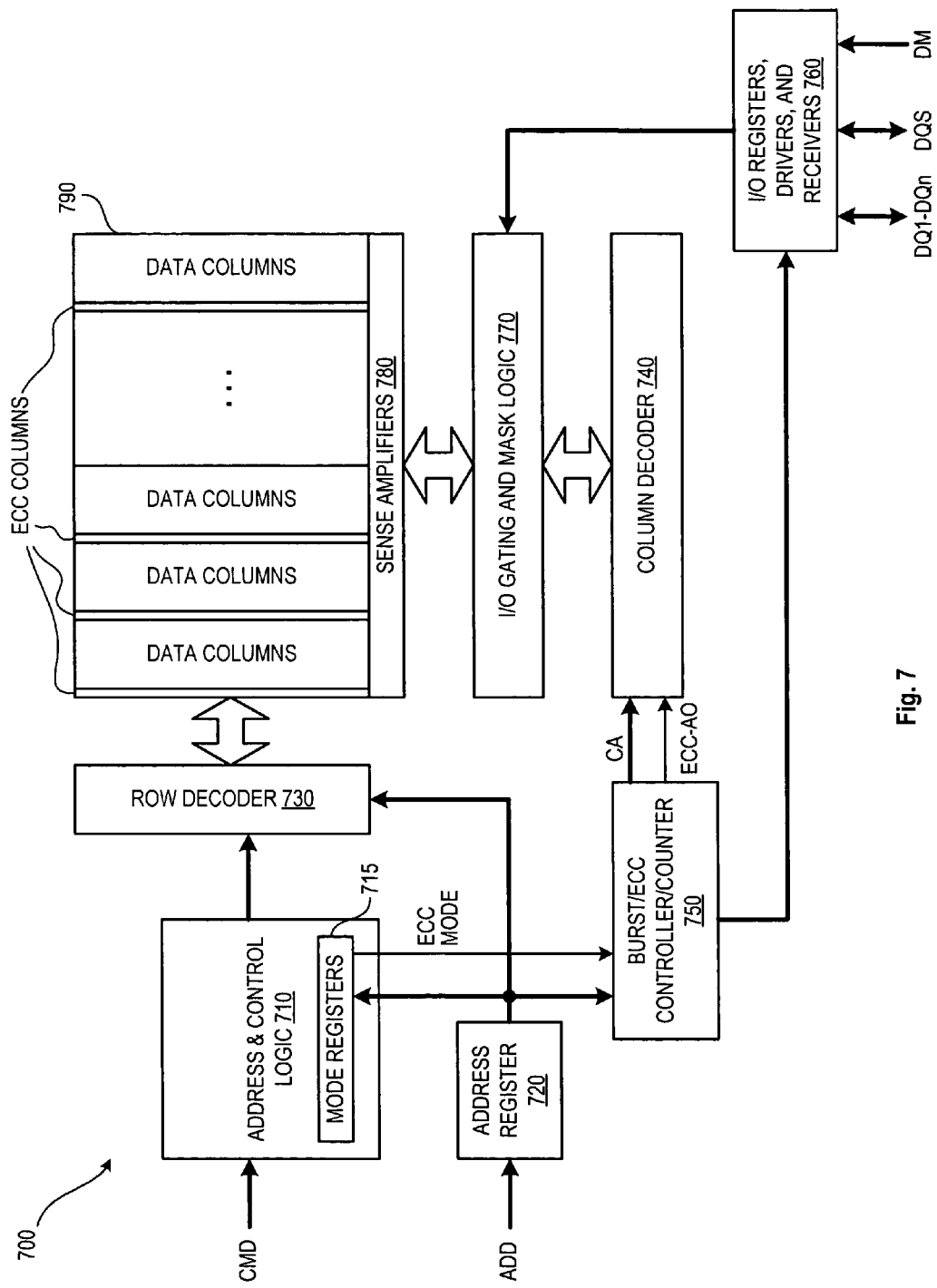
FIG. 7 contains a block diagram for a DRAM device according to an embodiment of the invention.

One embodiment of an ECB DRAM 700 is illustrated in the block diagram of FIG. 7. ECB DRAM 700 comprises address and control logic 710, an address register 720, a row decoder 730, a column decoder 740, a burst/ECC controller/counter 750, I/O registers, drivers, and receivers 760, I/O gating and mask logic 770, sense amplifiers 780, and a memory cell array 790. Several of these blocks will be familiar to those of ordinary skill in the art, but others are modified to accommodate error-correction bursting as described above. The following description focuses on cooperation between the blocks and new functionality that supports error-correction bursting.

Address and control logic block 710 receives commands on signal inputs CMD from, e.g., a memory controller. Typical commands include ACTIVE commands to select a word line in memory cell array 790, READ commands that specify columns in memory cell array 790 to read from, WRITE commands that specify columns in memory cell array 790 to write to, refresh commands, and various mode-setting commands.

During an ACTIVE command, a row address is received on signal inputs ADD and latched by address register 720—the row address is transferred to row decoder 730 by signals from address and control logic 710, and is then used to activate a corresponding row of memory cell array 790. Sense amplifiers 780 read and refresh the contents of the memory cell array row in response to the ACTIVE command.

During a READ command, a column address is received on signal inputs ADD and latched by address register 720. The column address is transferred to burst/ECC controller/counter 750 by signals from address and control logic 710. Burst/ECC controller/counter 750 will use the column address to control the selection and transfer of data from sense amplifiers 780 through the I/O gating and mask logic 770 to the I/O registers and drivers 760 during the data phase of the READ operation.

During a WRITE command, a column address is received on signal inputs ADD and latched by address register 720. The column address is transferred to burst/ECC controller/counter 750 by signals from address and control logic 710. Burst/ECC controller/counter 750 will use the column address to control the transfer of data to I/O gating and mask logic 770 from the I/O registers and receivers 760 during the data phase of the WRITE operation.

During at least some mode-setting commands, mode register values are received on signal inputs ADD and latched by address register 720. The mode register values are transferred to mode registers 715, shown in FIG. 7 as part of address and control logic 710. In some embodiments, one of the mode register values is ECC MODE, which indicates whether READ and WRITE burst commands will include extra data cycles for the transfer of ECC data. The mode register value ECC MODE is supplied to burst/ECC controller/counter 750, and will determine how burst/ECC controller/counter 750 selects data columns during read and write command data transfers.

Column decoder 740 selects n columns in memory cell array 790 for transfer of data between I/O gating and mask logic 770 and I/O registers 760 for each read or write data cycle. The n selected columns depend on the address supplied by burst/ECC controller/counter 750 for that data cycle. For write data, the selection of columns also depends on one or more data masking (DM) inputs received with the write data—when write data is indicated as masked, I/O gating and mask logic 770 blocks the transfer of that data to memory cell array 790.

The I/O registers, drivers, and receivers 760 operate in conventional fashion, except the burst length can be adjusted by burst/ECC controller/counter 750 to support ECC burst lengths and non-ECC burst lengths. During write bursts, receivers 760 receive data on I/O pins DQ1-DQn and data masking inputs on pins DM during each data cycle, where the data cycle is indicated by strobe signals on strobe I/O pin(s) DQS, and latch the received data and data masking inputs to the I/O registers for transfer to I/O gating and mask logic 770. During read bursts, I/O registers 760 receive data from I/O gating and mask logic 770, and the drivers drive the data on DQ1-DQn and a strobe signal on DQS.

The arrangement of memory cell array 790 contributes to the ability of ECB DRAM 700 to function in both ECC and non-ECC modes. For every eight data columns, an ECC column exists as well. This arrangement serves to illustrate one way in which an embodiment of the present invention can be implemented, where addressable column segments are associated with additional ECC columns; other arrangements and ratios of data to ECC columns are possible, as long as the burst/ECC controller counter and column decoder are matched to these other arrangements.

Further operation of ECB DRAM 700 will now be described in conjunction with FIG. 6A, assuming that ECB DRAM 700 is ECB-DRAM0 referred to in that figure. First, in response to an ACTIVE command, sense amplifiers 780 read data from a row of memory cell array 790, the row selected by row decoder 730. The data read by sense amplifiers 780 includes ECC data from ECC columns and user data from data columns.

Next, assuming that the error-corrected burst mode 5 is selected, the column address 0xC80, supplied with a READ command, is transferred to burst/ECC controller/counter 750 (it is noted that although FIG. 7 shows one bank of memory, ECB DRAM 700 could have multiple banks and use some bits of the column address as a bank select). Burst/ECC controller/counter 750 first signals column decoder 740 to select ECC columns associated with the column address 0xC80. This signaling, for instance, can comprise providing the starting column address 0xC80 on CA, while asserting an ECC address override signal ECC-AO. When the ECC-AO signal is asserted, column decoder 740 ignores the three low order bits of the address appearing on CA, and instead selects a ninth address associated with the externally addressable segment 0xC80-87. This ninth address is not directly addressable through an externally supplied column address, but is internally addressable by the column decoder in an ECC mode. The memory controller can thus only indirectly address the ECC data, by addressing a corresponding data segment in an ECC mode.

With the ninth address selected, I/O gating and mask logic 770 transfers data from ECC columns associated with external column addresses 0xC80-87 to I/O registers and drivers 760 for driving on DQ1-DQn during data cycle T0.

Burst/ECC controller/counter next transitions from an ECC address state to a data address state. It continues to supply the starting column address 0xC80 to the column decoder, but deasserts ECC-AO. This causes column decoder 740 to select data columns associated with that external address for transfer through I/O gating and mask logic 770 to I/O registers and driver 760 for driving on DQ1-DQn during data cycle T1.

Burst/ECC controller/counter increments its internal column address to 0xC81, and repeats the operation described above to supply data for data cycle T2. This process continues two more times to complete the five-data-cycle burst read operation of FIG. 6A.

When the mode registers 715 indicate that the ECC mode is not enabled, burst/ECC controller/counter 750 never enters the ECC address state and never asserts ECC-AO. The data address state remains the same, causing data columns but not ECC columns to be read in a four-data-cycle burst read operation.

In an error-corrected write burst mode, operation is analogous. At the appropriate data cycle or cycles, burst/ECC controller/counter 750 asserts ECC-AO to cause ECC columns associated with a segment of data columns indicated by CA to be selected for writing. The length of the write burst is extended to accommodate the extra data cycle or cycles in the error-corrected write burst mode. As mentioned previously, the ECC data can rely on the data masking signals DM, simplifying the logic and allowing the memory controller to determine on a fine-grain basis which ECC data will be written.

A mode register method of indicating ECC and non-ECC modes has been described. In such a system, one mode (e.g., non-ECC) can be selected as a default, unless changed by the memory controller. Another method of indicating ECC and non-ECC modes could be to provide two different commands. This method allows the memory controller to efficiently mix ECC and non-ECC data bursting, depending for example on the criticality of the data indicated by the processor.

Although a four-chip module and a 64-bit data bus are shown, this is merely exemplary and other numbers of chips or data bus widths can be used. For instance, a one-chip, two-chip, or eight-chip module can also be implemented according to the principles described above. The module need not have a single rank of memory devices either—for instance, two ranks of eight chips each could be included on a module. The present invention is also usable with systems that have memory devices mounted on the same circuit board with a processor that uses the memory devices.

One of ordinary skill in the art will recognize that the concepts taught herein can be tailored to a particular application in many other advantageous ways. In particular, those skilled in the art will recognize that the illustrated embodiments are selected from many alternative implementations that will become apparent upon reading this disclosure. For instance, many different temporal arrangements of user data and ECC data in a burst are possible, even some of which may mix ECC data and user data in some or all data cycles. Although DRAM embodiments have been described, the principles described herein apply equally to other types of semiconductor memory, such as static, flash, etc., as the principles apply to memory cell arrangement and data transfer and not to memory type. The particular functional arrangement of the device embodiments described herein present one possible functional grouping, but functions can be subdivided and/or combined in many other combinations that fall within the scope of the appended claims.

The described use for the present invention is error correction coding. Those skilled in the art will recognize, however, that the auxiliary memory space and burst transfer data cycles used for ECC could alternately be used to store and retrieve any auxiliary data that a processor and/or memory controller was configured to associate with an addressable memory address range.

Many of the specific features shown herein are design choices, and an explanation of many other design choices has been omitted as within the skill present in the art and/or implementation-dependent. Such minor modifications are encompassed within the embodiments of the invention, and are intended to fall within the scope of the claims.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

What is claimed is:

1. A method of operating a memory system, the method comprising:
   transmitting a data cycle burst such that error-protected data and error correction coding data pertaining to the error-protected data are temporally multiplexed onto the same data bus lines, wherein the transmitted data cycle burst is received by a memory device rank comprising at least one memory device, the memory device rank saving the error-protected data to an addressed segment of the memory device rank and saving the error correction coding data to an indirectly addressable segment of the memory device rank, the indirectly addressable segment of the memory device rank associated by the memory device rank with the addressed segment of the memory device rank;
   receiving the data cycle burst; and
   demultiplexing the data cycle burst to separate the error correction coding data from the error-protected data,
   wherein one data cycle of error correction coding is transmitted for a number of data cycles less than eight, the method further comprising masking a portion of the data transmitted during the one data cycle of error correction coding.

2. The method of claim 1, wherein one data cycle of error correction coding is transmitted for each eight data cycles of error-protected data.

3. The method of claim 1, further comprising the memory device rank determining from the address of the addressed segment which portion of the error correction coding data to mask.

4. The method of claim 1, further comprising at the device sending the error correction coding data to the memory device rank determining, from the address of the addressed segment, which portion of the error correction coding data to mask, and asserting corresponding mask signals to the memory device rank while transmitting the error correction coding data.

5. The method of claim 1, wherein the transmitted data cycle burst is transmitted by a rank of memory devices comprising at least one memory device, further comprising the device receiving the data cycle burst using the error correction coding data to detect and/or correct errors in the received error-protected data.

6. The method of claim 1, further comprising selecting a data burst mode having temporally multiplexed error correction coding data and error-protected data from among at least two data burst modes, at least one other of the data burst modes using the same addressing but transmitting data without temporally multiplexed error correction coding data.

7. A method of operating a memory device, the method comprising:
   receiving a command to read and transmit data in an addressable segment of the memory device;
   reading the data from the addressable segment and reading error-correction coding data from at least one indirectly addressable memory location associated with the addressable segment;
   transmitting data in the addressable segment in a multi-cycle data burst, temporally multiplexed on the same bus lines with the error-correction coding data;
   receiving a second command to receive and store data in the addressable segment of the memory device;
   receiving data for the addressable segment in a multi-cycle data burst, temporally multiplexed on the same bus lines with error-correction coding data; and
   writing the received data to the addressable segment and writing the received error-correction coding data to at least one indirectly addressable memory location associated with the addressable segment.

8. The method of claim 7, wherein whether error-correction coding data is temporally multiplexed is conditional on the type of burst mode selected from among at least two burst modes, at least one of which does not temporally multiplex the error-correction coding data.

* * * * *